United States Patent [19]

Gradl

[11] Patent Number: 4,521,752

[45] Date of Patent: Jun. 4, 1985

[54] PASSIVE TRANSIENT RECORDING SYSTEMS

[75] Inventor: David A. Gradl, Des Plaines, Ill.

[73] Assignee: Q-Dot, Inc., Des Plaines, Ill.

[21] Appl. No.: 431,609

[22] Filed: Sep. 30, 1982

[51] Int. Cl.³ .............. G11C 11/34; H03K 5/08; H03H 17/00; H01P 9/00

[52] U.S. Cl. .................... 333/165; 328/56; 328/151; 307/362; 307/353; 333/19; 333/166; 333/246

[58] Field of Search ............ 333/165, 166, 246, 19–20; 307/353, 362; 357/24; 328/151, 56; 324/76 A, 77 R, 77 A, 77 B, 77 CS, 77 D, 77 H; 365/103–105, 174, 184, 186, 192–197

[56] References Cited

U.S. PATENT DOCUMENTS

| | | | |
|---|---|---|---|
| 4,085,459 | 4/1978 | Hirabayashi | 307/362 X |
| 4,120,035 | 10/1978 | Cases et al. | 333/166 X |
| 4,152,606 | 5/1979 | Hornak | 307/353 X |
| 4,393,357 | 7/1983 | Linnenbrink et al. | 333/202 X |

Primary Examiner—Marvin L. Nussbaum
Attorney, Agent, or Firm—Fitch, Even, Tabin & Flannery

[57] ABSTRACT

Methods and apparatus for recording pulse signal information utilizing threshold integrating devices in which a pulse shaped signal is applied to a plurality of threshold integrating devices each having a predetermined quantity of electric charge carriers stored therein, in which the threshold integrating devices are responsive to application of electric potentials above a predetermined threshold potential value for altering the amount of charge stored in the charge storage zone of the threshold integrating devices. By providing a plurality of threshold integrating devices each having a different threshold potential, significant signal information may be obtained by passive application of the pulsed signal to a plurality of the devices. This signal information may be obtained by determining the amount of charge in the charge storage zones of the respective threshold integrating devices subsequent to application of the pulsed signal thereto.

13 Claims, 16 Drawing Figures

PASSIVE TRANSIENT RECORDING SYSTEMS

The present invention is directed to methods and devices for transient data recording, and more particularly, is directed to signal sampling integrated circuit devices of the high speed charge coupled device type, and to methods for utilizing such devices.

The recording of transient data has presented a significant challenge to instrumentation developers. Transient data (i.e., any high-bandwidth data, particularly including noncyclic or nonrepetitive data, in a low-bandwidth background) has been recorded with cameras mounted on oscilloscopes. The resulting photographs may then be digitized with manual or semi-automatic equipment. A conventional variation of the traditional recording oscilloscope, the scan converter, replaces the oscilloscope face with an electronically read storage matrix. Such systems have 2significant cost and performance limitations.

Conventional direct digital transient recorders are also known in which filtered, continuous analog data is sampled, digitized and stored digitally in real-time. Such direct digital transient recorders similarly have significant cost and performance limitations.

Transient data recorders have also used high speed charge coupled devices (CCD's) to provide a dual-speed analog buffer. Full-rate, sampled analog data (i.e., discrete-in-time, continuous-in-amplitude data) are shifted into the CCD in a charge-equivalent-to-signal form at the full sampling rate, which may typically be five times the bandwidth. Data are continuously shifted in until a trigger stops the process. The trigger can occur before, during or after the event of interest. Once the event is captured, the data may be shifted out of the CCD at a slower rate [Y. T. Chan, et al., "Extremely High Speed CCD Analog Delay Line", Proceedings of 1975 International Conference on the Application of Charge-Coupled Devices, San Diego, Calif. Oct. 29-31, 1975, pp. 389-398; D. A. Gradl, et al., "High Speed Operation of CCDs", ibid., pp. 399-412; T. E. Linnenbrink, et al., "A CCD-Based Transient Data Recorder", ibid., pp. 443-453; J. W. Balch, et al., "A CCD Integrated Circuit for Transient Data Recorders", Proceedings of Conference on Charge-Coupled Device Technology and Applications, Washington, D.C., Nov. 30--Dec. 2, 1976, pp. 115-119; and T. E. Linnenbrink, et al., "A One Gigasample per Second Transient Recorder", IEEE Transactions on Nuclear Science, Vol. NS-26, No. 4, August, 1979, pp. 4443-4449].

Integrated circuits utilizing charge transfer under signal influence are described in copending application Ser. No. 231,292 filed Feb. 4, 1981 now U.S. Pat. No. 4,393,357, of applicant and another, which is hereby incorporated by reference.

However, further improvements in transient data recording, particularly in respect to methods and apparatus for recording significant transient signal information without a requirement for complicated and expensive high frequency, driver, clock, trigger or other control signals would be desirable.

Accordingly, it is an object of the present invention to provide methods and apparatus which are particularly adapted for recording signal information upon application of a transient data pulse.

These and other objects of the present invention will become more apparent from the following detailed description and the accompanying drawings, of which:

Integrated circuit devices are provided for recording pulse shaped signal information, comprising a plurality of threshold integrating devices each comprising means for accumulating charge in a potential well upon application of at least one signal thereto in excess of a predetermined threshold potential value. Each of the threshold integrating devices is provided with a different threshold potential value, so that integration of the signal time-amplitude waveform effectively provided. In addition, means are provided for measuring the amount of charge accumulation in the respective potential wells of each of said threshold integrating devices. The rate of charge accumulation of the threshold integrating device is determined by the difference between the signal potential applied thereto and the respective threshold value, and the duration during which said signals exceeds said respective potential value.

The threshold integrating devices may be fabricated utilizing charge coupled device (CCD) technology, in which each of the threshold integrating devices comprises a charge transfer channel of one conductivity type, an input zone of opposite conductivity type, an accumulation electrode for forming a potential accumulation well in the transfer channel and at least one control electrode for receiving the signal to be recorded and for regulating the flow of charge carriers from the input zone to the accumulation zone. Such devices will further comprise means for applying an electrical potential to the input zone to establish a potential threshold which must be exceeded in the transfer channel under the control electrode to establish charge carrier flow to the accumulation zone.

By dispersively filtering the signal and subsequently carrying out a passive threshold signal integration from a plurality of baseline potentials, significant signal information may be recorded. In this regard, integrated circuit devices for passive signal recording may be provided comprising means for receiving a pulse signal to be analyzed, first threshold integrating device means for accumulating charge in a plurality of charge storage zones as respective functions of the length of time the signal exceeds a plurality of different threshold potentials, first means for dispersively filtering said signal in accordance with a predetermined or fixed filter function to provide a signal of altered waveform, and second threshold integrating means for acumulating charge in a plurality of charge storage zones as respective functions of the length of time the altered signal exceeds a plurality of different threshold reference potentials.

Methods and apparatus in accordance with the present invention do not necessarily require high frequency clocking or triggering control signals. Rather, the passive recording may be carried out using external DC biasing and very slow clock signals (e.g., 100 KHz) to output the recorded data. Passive recorder devices may desirably be implemented on an integrated circuit, such as a CCD, as will be described.

The method is particularly adapted for pulse-shaped transient signals such as often occur in laser and inertial containment fusion experiments, ultrasonic transmission of reflection data or other pulse signals in which the signal amplitude increases in one direction at the beginning of the event and eventually returns to its original baseline after effects of the event have subsided. Because methods and devices in accordance with the present invention do not necessarily require an external trigger signal, the output data will represent the shape of the recorded signal, but will not directly provide time position information of the signal, relative to any external timing reference, without additional processing steps or circuit elements.

Having generally described various method and device aspects of the present invention, the invention will now be more particularly described with respect to the specific emobdiments illustrated in FIGS. 1-16.

Figure 1:
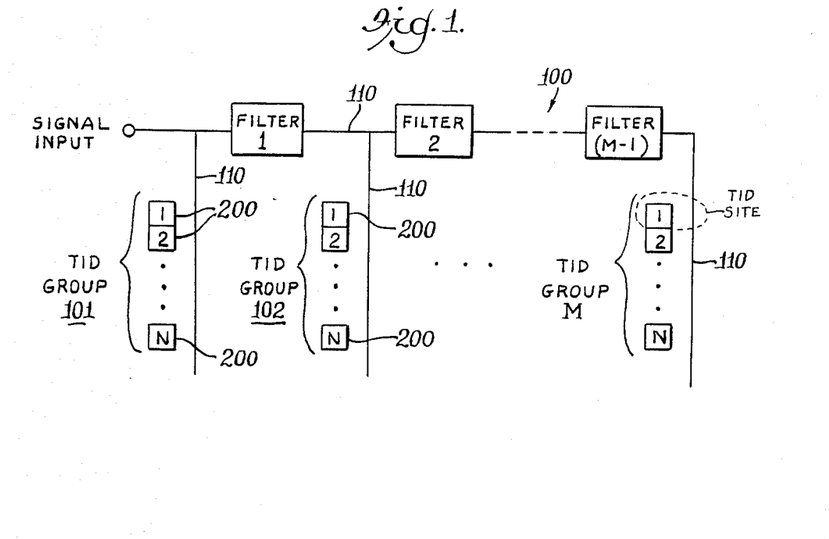
FIG. 1 is a schematic representation of an embodiment of a passive transient recorder in accordance with the present invention, which includes a plurality of arrays of threshold integrating devices.

Illustrated in FIG. 1 is a passive transient recorder system 100 which comprises multiple groups of threshold integrating devices (TID's) 200 (FIG. 2) along a signal transmission line 110 and a series of frequency dispersive filter elements 101, 102, etc. which process the input signal prior to its application of the threshold integrating devices 200.

Figure 5:
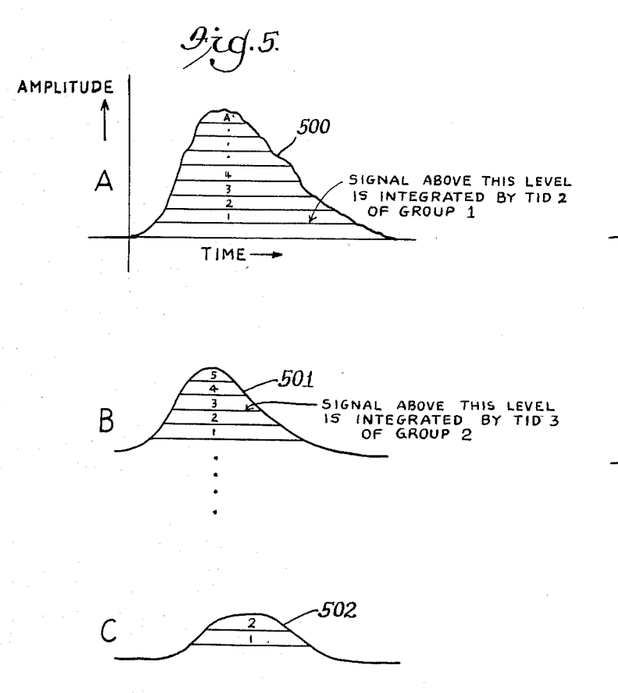
FIG. 5 is a graphic representation of several successive processing stages A, B and C, of a transient data signal processed by means of the passive recorder of FIG. 1, utilizing low pass filter stages between groups of threshold integrating devices.

The threshold integrating device element 200 provides a time integration function in respect to an applied signal for the period in which the signal level is above some predetermined level (the threshold) of the device. After the signal level has permanently fallen below the threshold level, the integration process is completed. The function which is integrated by the threshold integrating device is substantially the signal voltage less the threshold voltage of the threshold integrating device, as will be more fully described. For a linear integrating process, the threshold integrating device output for any respective device 200 will correspond to the respective area under the signal curve and above its respective threshold potential line as shown in FIG. 5.

As illustrated in FIG. 1, each threshold integrating device group 101, 102, etc. comprises a plurality of (N) threshold integrating device's each of which has a different threshold voltage, which is designated by each threshold integrating device number. For example, each threshold integrating device may differ in threshold value from a preceeding threshold integrating device in increments of 0.1 volt. The input signal is applied to each threshold integrating device at group 101 yielding a set of integrated signal values which are shown graphically in graph A of FIG. 5 showing the amplitude versus time waveform of the applied signal pulse 500, in which the area between each horizontal (threshold) line and the portion of the signal above it represents the value which each threshold integrating device in group 101 will generate, after the signal has been applied.

The transient analog signal is also applied to filter 111 of the passive recorder device 100 of FIG. 1 and then applied to each threshold integrating device in threshold integrating device group 102. Filter 111 acts to reduce or remove certain frequency components in the analog signal, thus changing its shape, as represented by a function of time, as shown in graph B of FIG. 5. Again, the threshold integrating devices determine the areas above the horizontal lines and below the signal function at group 102 in a manner identical to that described in respect to threshold integrating device group 101.

In a similar manner, as indicated by FIG. 1, the input signal is successively applied to a threshold integrating device group, then dispersively filtered and applied to the next threshold integrating device group. This process is continued, as shown in FIG. 1, so that some number (M) of threshold integrating device groups have recorded the signal each with a different filtering function having been applied to the original input signal, before recording. FIG. 5 illustrates the greatly changed signal function and corresponding threshold integrating device areas which occur at the last threshold integrating device group (M).

Figure 6:
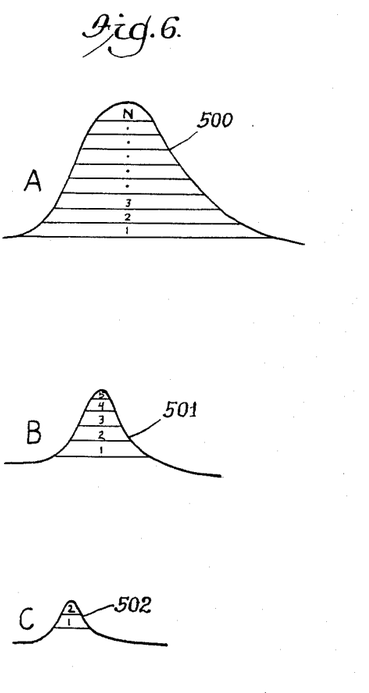
FIG. 6 is a graphic representation of several successive processing stages A, B and C, of a transient data signal processed by means of the passive recorder of FIG. 1, utilizing high pass filter stages between groups of threshold integrating devices.

FIG. 5 illustrates signal processing of a passive recorder 100 utilizing low-pass filter elements provided between each threshold integrating device group. High-pass filter elements may also be provided between threshold integrating device arrays, which would provide significantly different signal reshaping at each filter element, as depicted in FIG. 6. A wide variety of dispersive-filtering functions may be used, depending on the signal information which is desired.

Figure 7:
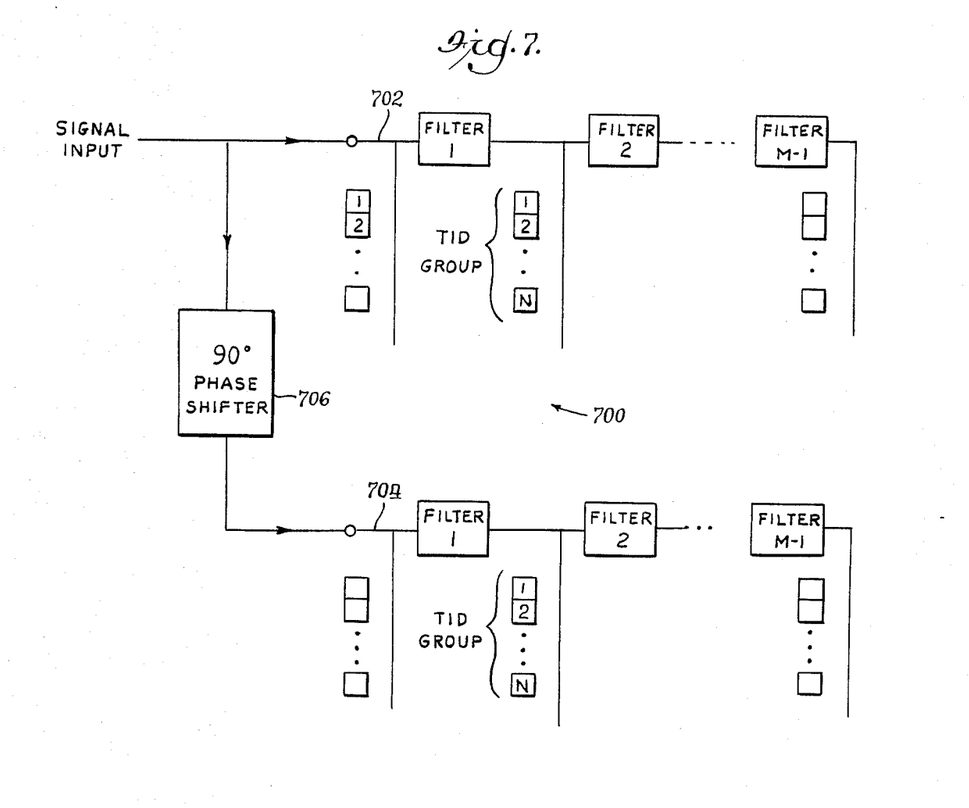
FIG. 7 is an embodiment of a passive recorder system wherein the signal filtering includes 90 degree phase shifting of the transient data signal to provide a quadrature processing configuration.

Devices such as recorder 100 may be combined in more complex passive recording structures, such as the quadrature processing structure 700 shown in FIG. 7.

The illustrated embodiment 700 comprises two passive recorder structures 702, 704, like that of FIG. 1, combined with a wide-band 90 degree phase shifter 706 to provide parallel quadrature processing of the input signal. The quadrature method of signal processing is commonly used to maintain both amplitude and phase information of a signal being processed.

In operation of passive recorders of the type illustrated in FIGS. 1 and 7, the threshold integrating devices are zeroed (set to a known output state) prior to the occurrence of the input signal, and the input signal is applied or occurs causing each threshold integrating device to perform the integration process which has been described.

After the input signal pulse has subsided, the threshold integrating device output values may be removed and digitally recorded (e.g., by means of analog to digital conversion and memory storage) at some slow convenient rate.

The digital data is then processed in a manner to reconstruct the original input signal, or to otherwise utilized the recorded information.

Figure 8:
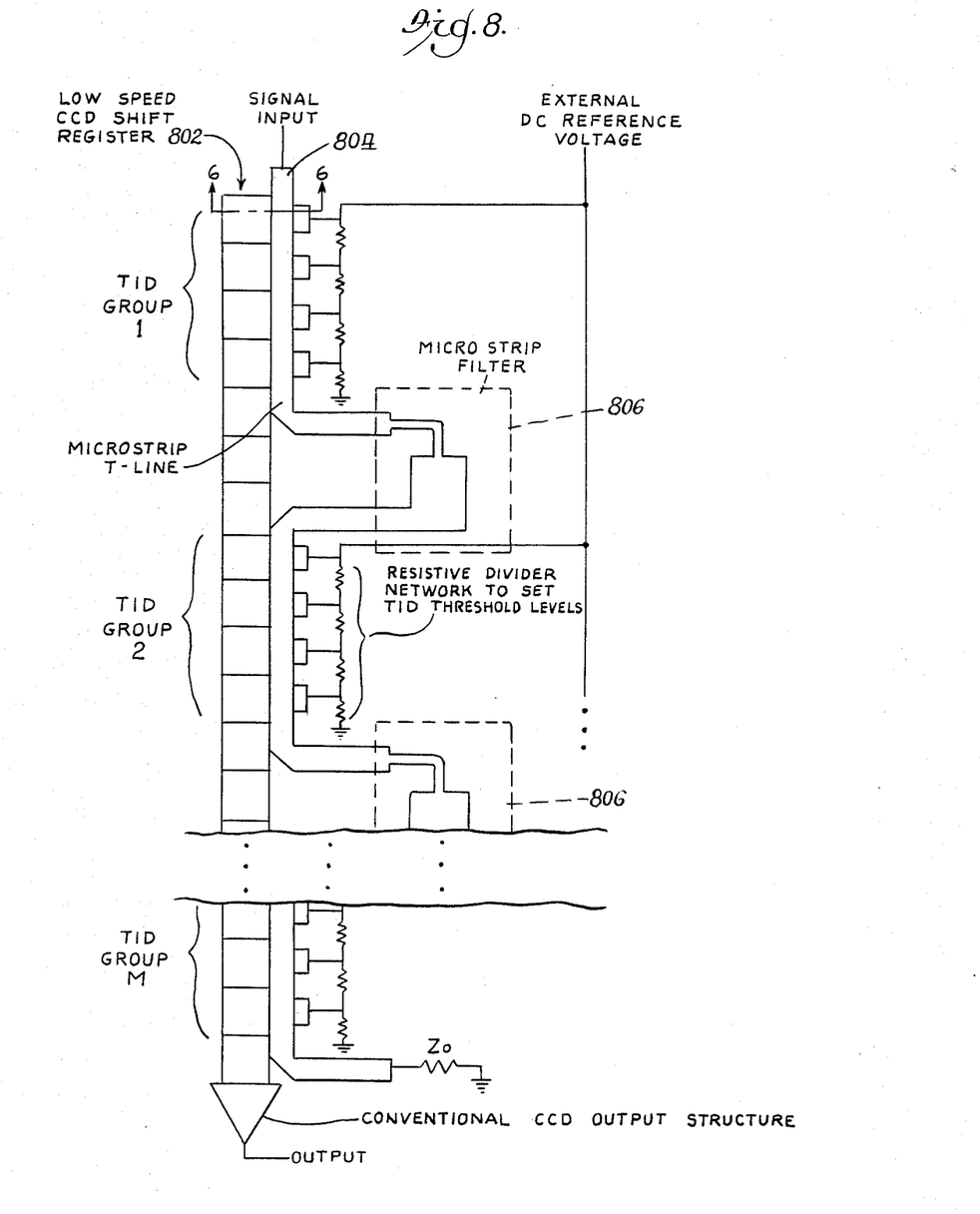
FIG. 8 is a schematic illustration of an embodiment of a passive transient data signal recorder, in serial array illustrating an arrangement of signal filtering stages and having divider networks to set threshold integrating device threshold levels.

A serial integrated circuit CCD implementation of the passive recorder 100 of FIG. 1 is shown in FIG. 8. It comprises a conventional low speed CCD shift register 802 with threshold integrating device groups placed adjacently along multiple non-overlapping segments of the register. A signal microstrip transmission line 804 is used to propagate the input signal to each threshold integrating device within group 1 and then to a microstrip filter 806 (which may be a part of the CCD integrated circuit). The signal is reshaped by the filter and combines on down the microstrip T-line to threshold integrating device group 2 where it is applied to the threshold integrating devices there located. The signal path continues in a similar manner until it has reached the Mth of final threshold integrating device group. At this point the signal line is terminated in its characteristic impedance. Although only four threshold integrating devices are shown in each threshold integrating device group, the number could be much greater (i.e., 10 to 500).

Figure 2:
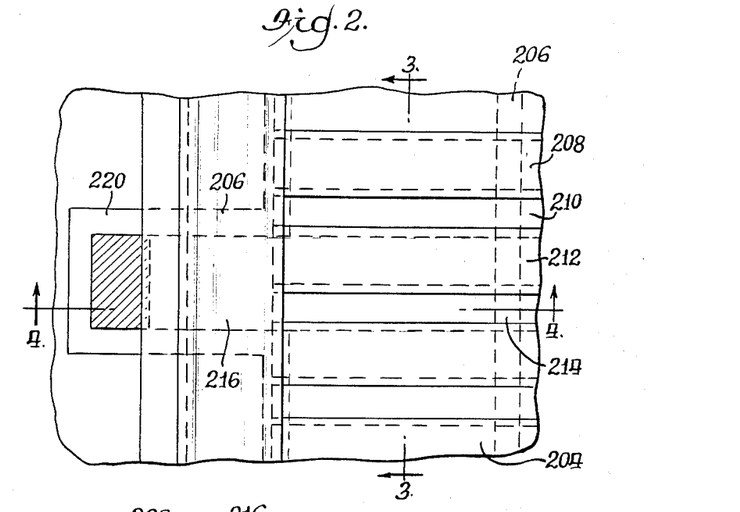
FIG. 2 is a top view of a threshold integrating device cell of the passive recorder of FIG. 1.
Figure 3:
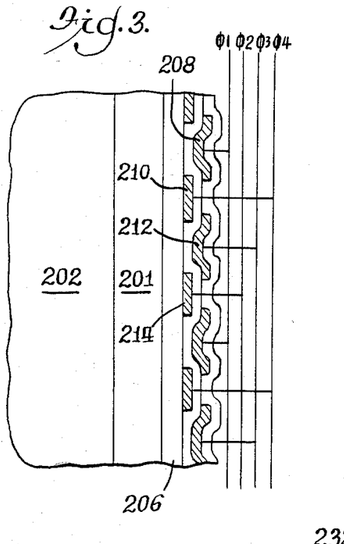
FIG. 3 is a cross sectional side view, taken through line 3—3, of the device of FIG. 2.
Figure 4:
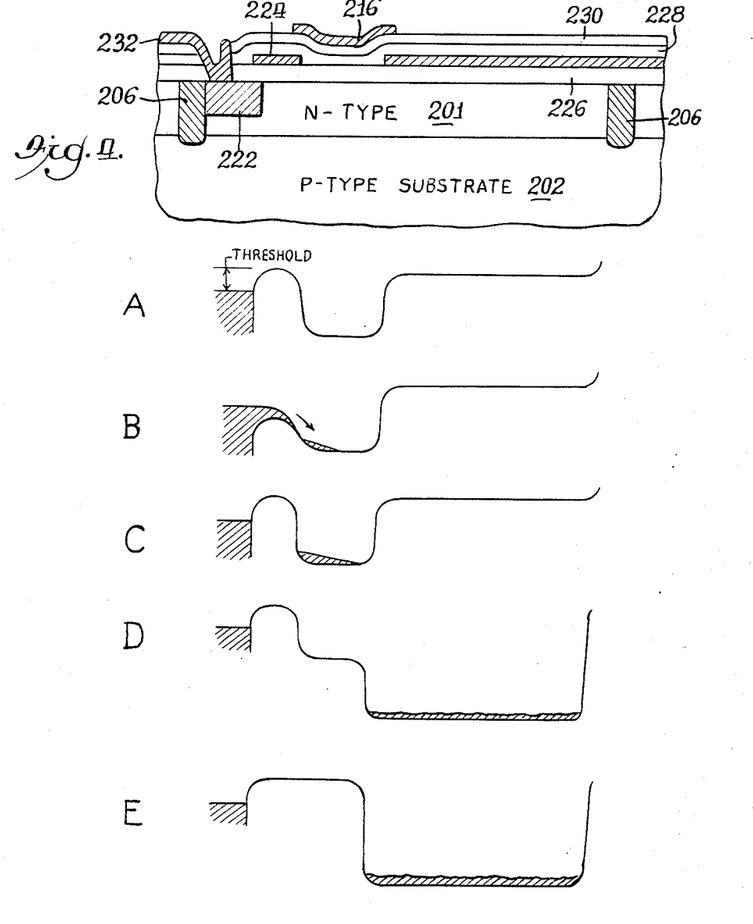
FIG. 4 is a cross sectional side view, taken through line 4—4, of the device of FIG. 2, together with schematic representations A, B, C, D and E of various operational states of the device.

A cross sectional view of the threshold integrating device cell 200 suitable for use in the devices 100, 800 is shown in FIGS. 2–4. As will be more fully described, the threshold integrating device structure 200 utilizes an input diffusion which is a source of charge, a signal gate and an accumulation gate. Channel stops are provided to contain the charge in the cell region. The accumulation gate also serves as one of the slow CCD register gates.

The threshold integrating cell 200 is fabricated as a portion of an integrated circuit on a suitable p-type silicon substrate 202. The device comprises a CCD transfer channel 204 defined by p-type channel stop 206, and a plurality of gate components including four phase transfer gates 208, 210, 212, 214 together with accumulation gate 216, which extends orthogonally along one side of the transfer channel 204 to define the transfer channel with implant 206 in operation. The cell 200 further includes a threshold integrating device 220 comprising an n-type input diffusion 222 and a microstrip signal gate 224 which function together with the accumulation gate 216 in the passive signal recording as will be explained hereinafter. The transfer channel 204 and the associated threshold integrating device cell 220 are fabricated utilizing buried channel construction in which the charge carriers are electrons in depleted n-type substrate 201. The electrodes 208, 210, 212, 214, 216, 224 are separated by appropriate dielectric layers 226, 228, 230 in accordance with conventional fabrication practice. The input diffusion 222 provides a source of input electrons to the n-type substrate 201 and is maintained at a predetermined threshold potential by means of ohmic contact connection lead 232.

Operation of the cell 200 is described by the state diagrams A, B, C and D of FIG. 4. In state A, the accumulation well is emptied by shifting all residual charge out of the CCD register into the output structure. The potential barrier level under the signal gate in A is with no signal yet applied to the input gate. An external DC voltage is applied to the input gate. An external DC voltage is applied to the input diffusion to set the charge level and thus the threshold integrating device threshold voltage, as indicated in A.

State B shows the beginning of the signal integration process. At this point, the signal voltage has changed such that the potential barrier under the input gate has dropped down to the charge level and charge will now begin to flow across the input gate region, into the accumulation wells at a rate determined by the signal gate voltage as shown in State C. The integration stops when the signal voltage changes such that the barrier comes back up to the charge level under I.D. and terminates the flow into the accumulation well.

After state C, the amount of charge existing under the accumulation gate represents the threshold integrating device output and is ready to be transferred into the serial CCD register. After charge is transferred into the register, as shown in state D, the potential barrier under the accumulation gate is raised as shown in state E. The register is then ready to serially transfer the charge out of the CCD.

Figure 9:
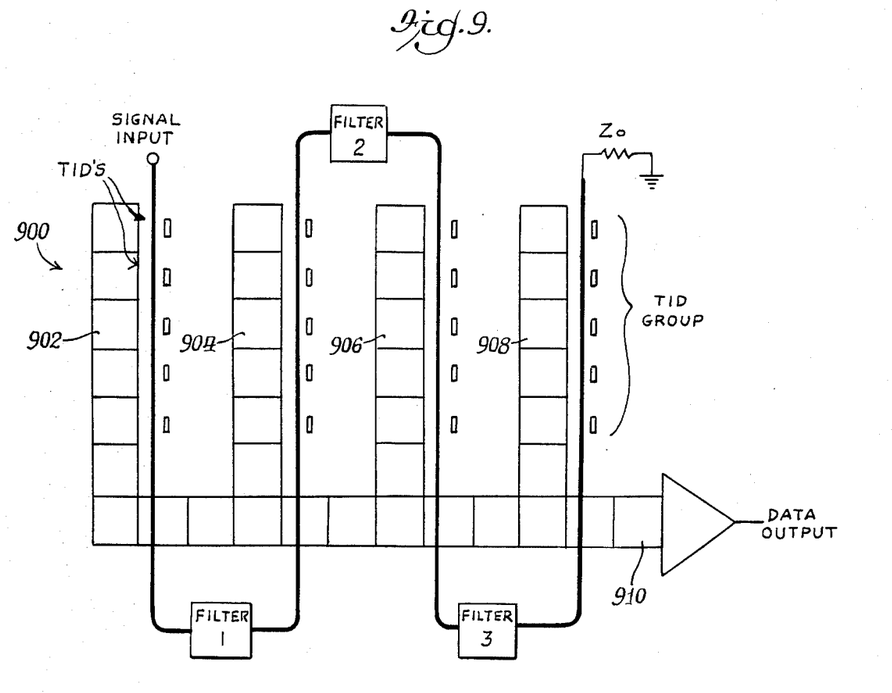
FIG. 9 is a schematic illustration of a slow CCD register, parallel serial configuration of a passive recorder.

An additional embodiment 900 of a passive recording system utilizing a serial-parallel CCD architecture is shown in FIG. 9. Here, the threshold integrating device groups are situated along separate CCD registers 902, 904, 906, 908 which are multiplexed together via the horizontal CCD register 910. All data is brought out of the structure by means of a single output port. This configuration offers reduced threshold integrating device data degradation due to CCD charge transfer inefficiency. The total number of CCD cells in the structure may be very large.

Figure 10:
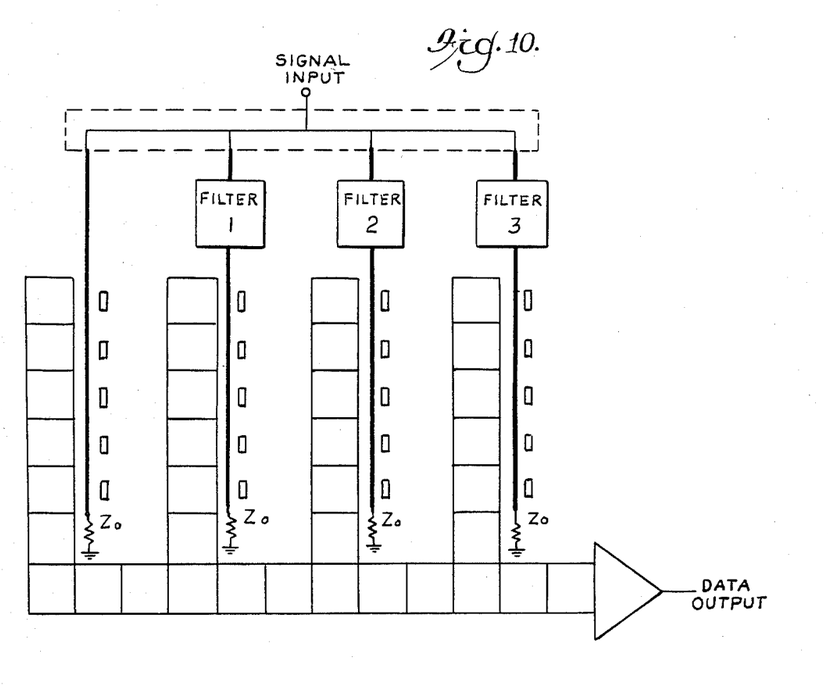
FIG. 10 is a schematic illustration of an alternative embodiment of a passive recorder.

Another alternate passive recorder CCD architecture is shown in FIG. 10 in which the CCD register structure is identical to that of FIG. 9. The input signal structure, however, is a branched version, which distributes the input signal to a filter associated with each threshold integrating device group. The output of each filter is applied to its respective set of threshold integrating devices. This approach permits independent filter response for each threshold integrating device group. It may also offer layout advantages and permit the useof higher impedance (narrower gate width) input signal lines, to facilitate fast threshold integrating device charge flow and signal response.

Figure 11:
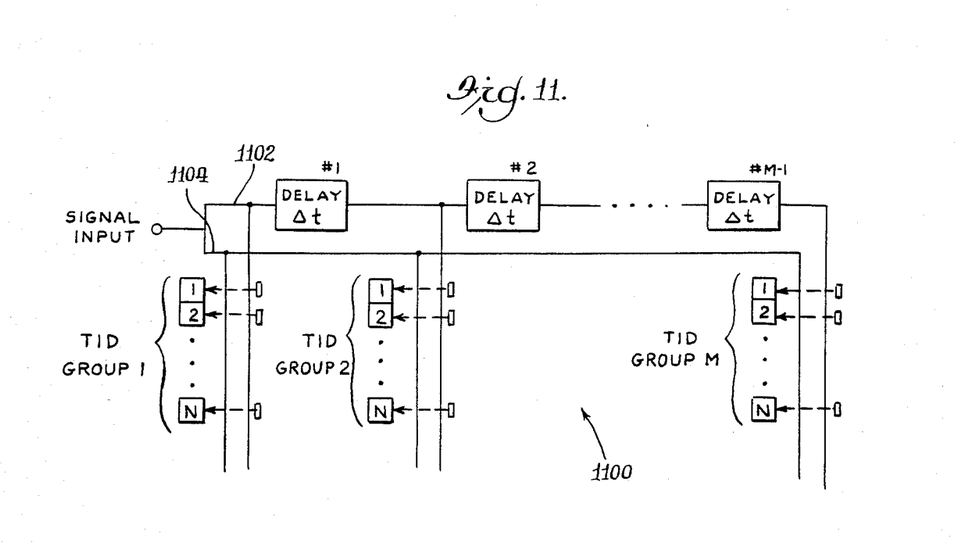
FIG. 11 is a schematic illustration of an alternative embodiment utilizing fixed time delay filtering.

Illustrated in block diagram in FIG. 11 is another embodiment of an integrated circuit passive recorder device 1100 which utilizes fixed transient signal time delay to obtain signal information in the time domain. The illustrated structure comprises a plurality of (M) groups of dual input threshold integrating devices, each group having a plurality of (N) threshold integrating devices. Within each group, a different threshold value is provided for each threshold integrating device.

The input signal is split into two lines 1102, 1104, one of which goes as directly as possible to an input of each threshold integrating device. The other line goes to a series of fixed delays whose outputs feed the second inputs within each threshold integrating device group. That is, the delay 1 output is applied to all threshold integrating device group 2 threshold integrating devices, and delay 2 goes to group 3 threshold integrating devices and so-on to the final threshold integrating device group M, as shown in FIG. 11.

A dual input threshold integrating device is similar to that described in respect to FIGS. 1–10, the first method, except that it has two separate signal inputs. Operationally, a signal integration process begins when the signal voltage of each input exceeds the designated threshold voltage of the threshold integrating device. At that time, the lower of the two input levels is integrated in time until one or both of the input voltages drops below the threshold voltage. At this point, the integration process ends.

Figure 12:
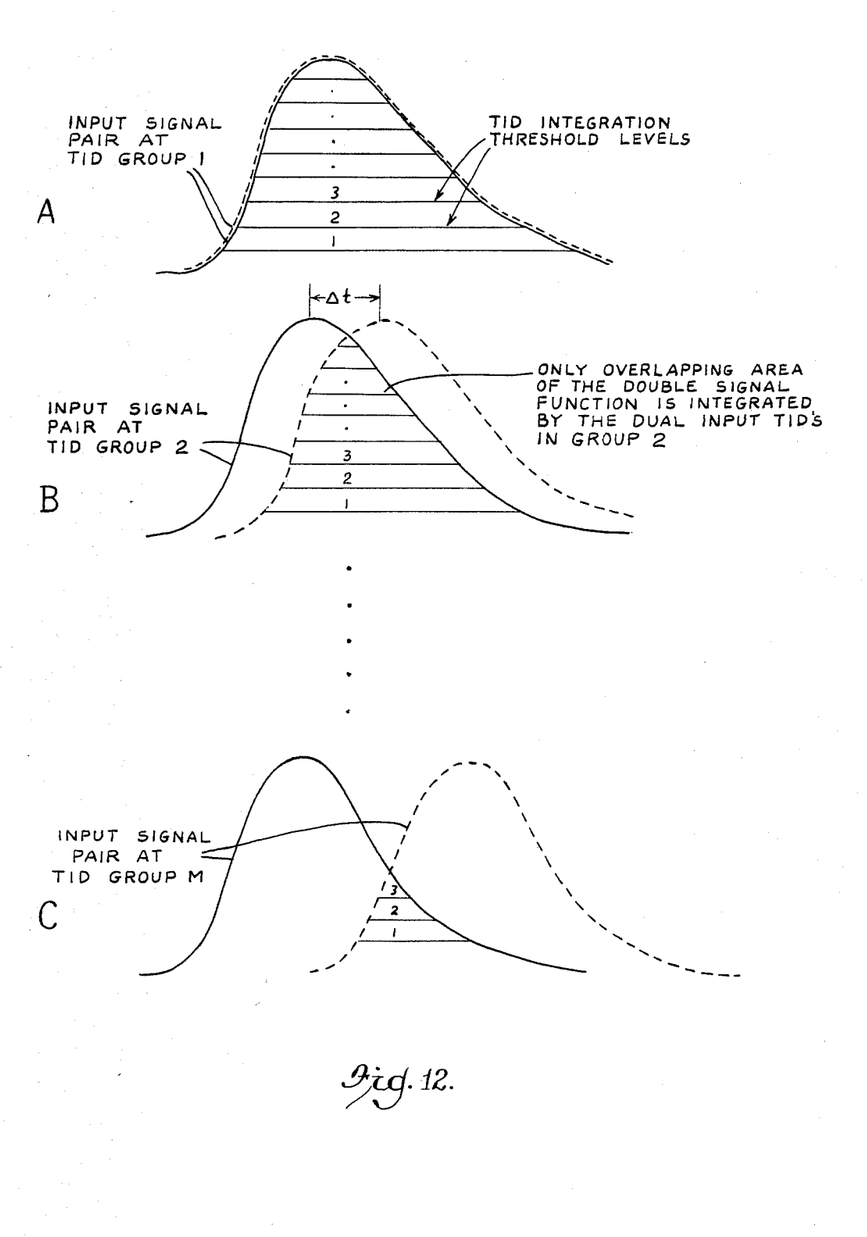
FIG. 12 is a graphic representation of several successive processing stages A, B and C and of a transient data signal processed by means of the passive recorder of FIG. 11 utilizing fixed time delay filtering stages between groups of threshold integrating devices.

The threshold integrating device processing of a transient signal is depicted in FIG. 12, in a manner similar to that described by FIGS. 5 and 6 in respect to the signal processing of recorder 100 of FIG. 1. In FIG. 12, the signal functions applied to the two threshold integrating device inputs of group 1 are shown. Since no delay of signal was provided for this group (see FIG. 11), the two transient signal functions coincide. The areas under the signal functions and above the horizontal lines represent the respective threshold integrating device output values after the integration period. Each threshold integrating device within the group 1 has a unique threshold potential level above which it carries out charge accumulation, as is indicated on the horizontal lines.

At threshold integrating device group 2, the two signal functions no longer coincide, as shown in FIG. 12. Here the signal function which is applied to the second input of each threshold integrating device is delayed by a predetermined time T. The resulting integration occurring at each threshold integrating device is represented by the shaded area above each horizontal line, for each respective threshold integrating device as indicated in FIG. 12. At each successive threshold integrating device group the signal delay is increased, thereby reducing the integrated area, as shown in FIG. 12.

Figure 13:
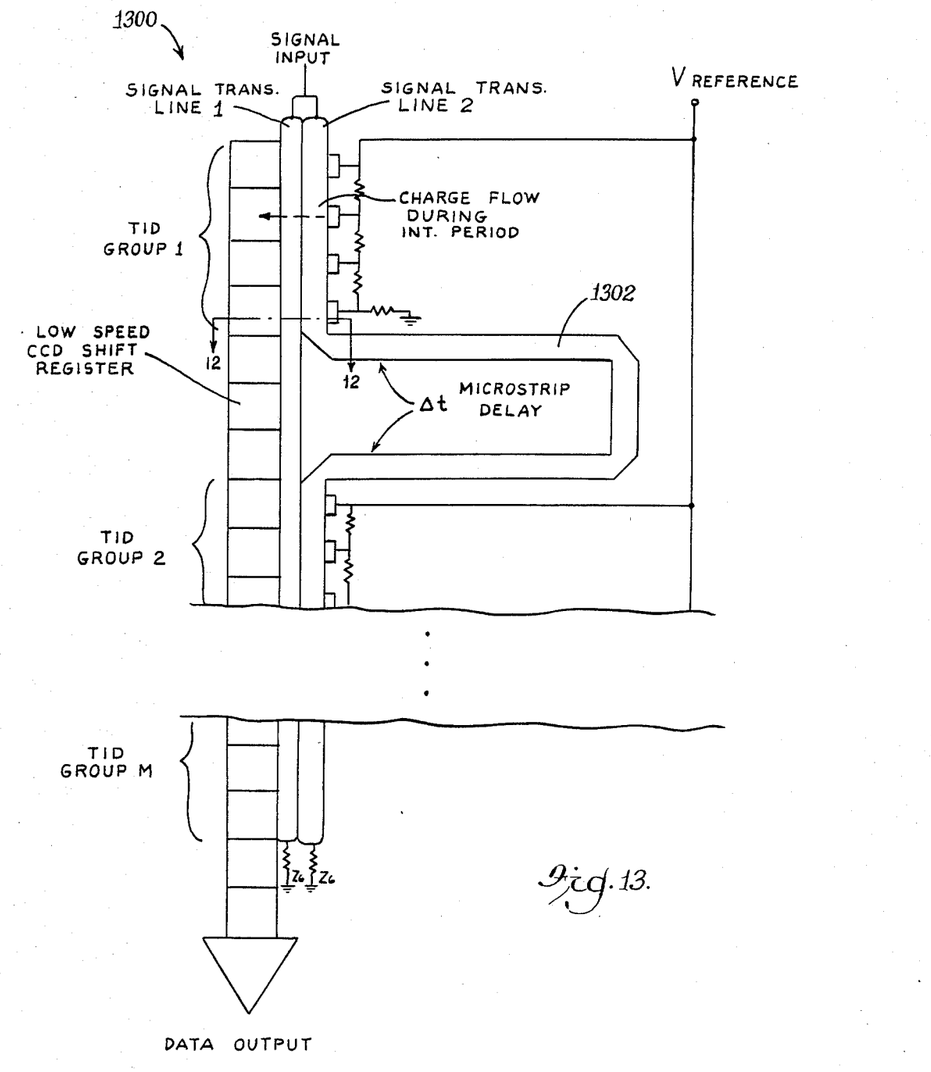
FIG. 13 is a schematic illustration, in top view, of a circuit layout for the fixed time delay processing passive recorder system of FIG. 11 illustrating the dual input microstrip signal line.
Figure 14:
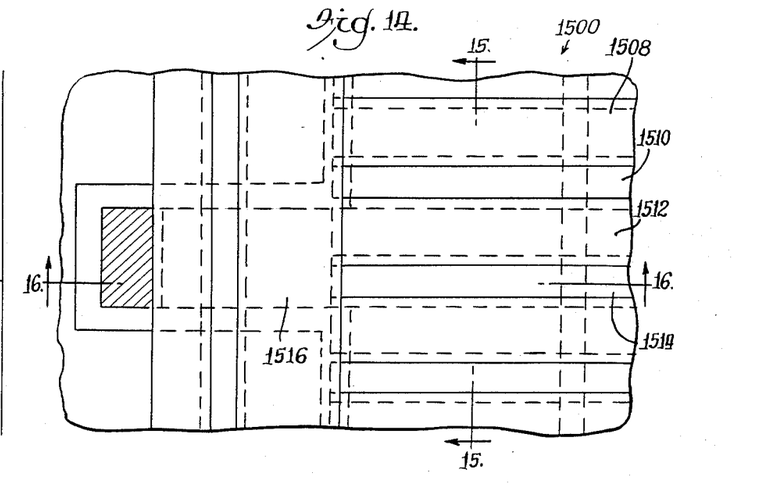
FIG. 14 is a top view of a threshold integrating device cell of the passive recorder of FIG. 11.
Figure 15:
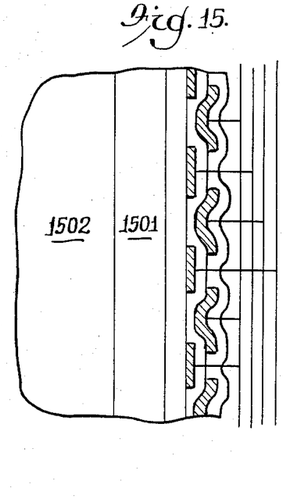
FIG. 15 is a cross sectional side view, taken through line 15—15, of the device of FIG. 14.
Figure 16:
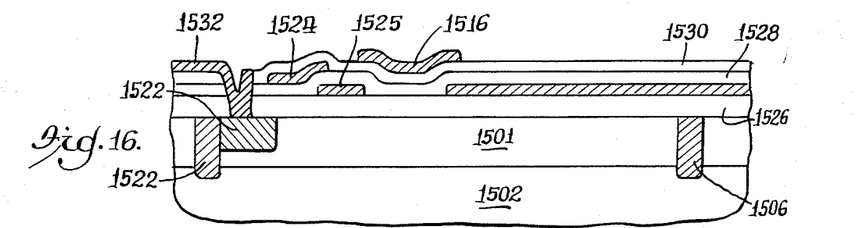
FIG. 16 is a cross sectional side view, taken through line 16—16, of the device of FIG. 14, together with schematic representations A, B, C, D and E of various operational states of the device.

An integrated circuit CCD implementation 1300 of a dual input threshold integrating device system is shown in FIG. 13, which utilizes a serial structure similar to that of device 700 of FIG. 7. However, each of the threshold integrating devices are dual input cells which accept two signal lines, as shown in FIGS. 14–16. Moreover, a microstrip delay line 1302 replaces the microstrip filters of the device 700 of FIG. 7, which affects the signal function as it propagates from one threshold integrating device group to the next.

A cross sectional view of a dual input threshold integrating device 1500 is shown in FIGS. 14–16, which is similar to device 200 of FIGS. 2–4, except that a second signal gate element has been added.

Illustrated in FIG. 15 is an embodiment 1500 of a threshold integrating cell which is fabricated as a portion of an integrated circuit on a suitable p-type silicon substrate 1502. The device comprises a CCD transfer channel 1504 defined by p-type channel stop 1506, and a plurality of gate components including four phase transfer gates 1508, 1510, 1512, 1514 together with accumulation gate 1516, which extends orthogonally along one side of the transfer channel 1504 to define the transfer channel with implant 1506 in operation. The cells 1500 further includes a threshold integrating device 1520 comprising an n-type input diffusion 1522 and microstrip signal gates 1524, 1525 which function together with the accumulation gate 1516 in passive signal recording as will be explained hereinafter. The transfer channel 1504 and the associated threshold integrating device cell 1520 are fabricated utilizing buried channel construction in which the charge carriers are electrons in depleted n-type substrate 1501. The electrodes 1508, 1510, 1512, 1514, 1516, 1524 are separated by appropriate dielectric layers 1526, 1528, 1530 in accordance with conventional fabrication practice. The input diffusion 1522 provides a source of input electrons to the n-type substrate 1501 and is maintained at a predetermined threshold potential by means of ohmic contact connection lead 1532.

The state diagrams A, B, C and D in the figure illustrate the operation of the device 1500 in a manner similar to that previously described in respect to FIG. 4. Note that charge does not start to flow until both signal gate barriers drop below the charge level (state C), and also that charge flow stops as soon as a single input gate barrier rises above the charge level (state D).

The operation of the dual input embodiment is substantially similar to that previously described for the embodiments 100 and 700. Passive recording methods which use dual input threshold integrating devices and signal delay elements may be implemented in a variety of architectures, such as one similar to FIGS. 7, 9 and 10.

It is anticipated that a given recording structure may have associated with it certain constraints and/or appropriate knowledge of the input signal, such as polarity, maximum amplitude and time duration, signal band width, and perhaps general pulse shape, which may facilitate signal reconstruction, if such reconstruction is desired.

While the present invention has been particularly described with regard to a number of specific embodiments, it will be appreciated that various modifications and adaptations may be made based on the present disclosure which are within the spirit and scope and the present invention as set forth in the following claims.

What is claimed is:

1. An integrated circuit device for recording pulse shaped signal information, comprising a plurality of threshold integrating devices each comprising means for accumulating charge in a potential well upon application of at least one signal thereto in excess of a predetermined threshold potential value, each of said threshold integrating devices having a different threshold potential value, means for receiving a pulsed signal to be analyzed and for applying said signal to be analyzed to each of said plurality of threshold integrating devices, and means for measuring the amount of charge accumulation in the respective potential wells of each of said threshold integrating devices.

2. A device in accordance with claim 1 wherein the rate of said charge accumulation in said potential wells of said threshold integrating devices is determined by the difference between the signal potential applied thereto and the respective threshold potential value of the respective threshold integrating device, and the duration during which said signal exceeds said respective threshold potential value.

3. A device in accordance with claim 2 wherein said device comprises from 10 to 500 threshold integrating devices.

4. A device in accordance with claim 1 wherein each of said threshold integrating devices comprises a charge transfer channel of one conductivity type, input zone means for introducing charge carriers into said charge transfer channel, an accumulation electrode for forming a potential well charge accumulation zone in said transfer channel, at least one control electrode for receiving the signal to be recorded and for regulating the flow of said charge carriers from said input zone means to said accumulation zone, and means for applying an electrical potential to said input zone means to establish a potential threshold which must be exceeded in the transfer channel under the control electrode to establish charge carrier flow to said accumulation zone.

5. A device in accordance with claim 4 wherein each of said threshold integrating devices is provided with two control electrodes disposed between said input zone and said accumulation zone for regulating the flow of said charge carriers between said input zone and said accumulation zone.

6. A device in accordance with claim 5 utilizing fixed transient signal time delay, wherein said pulsed signal to be analyzed is transmitted directly between said plurality of threshold integration devices along one of said two control electrodes, wherein the other of said two control electrodes is provided with means for delaying said signal to be analyzed by a predetermined amount, such that charge transfer occurs when the signal at each control electrode exceeds the threshold value of the respective threshold integrating device.

7. A method for recording pulse shaped signal information comprising the steps of
providing a plurality of charge storage zones each having a predetermined quantity of electrical charge stored therein, each of said charge storage zones having a different threshold potential with respect to the potential of an applied pulsed signal to be analyzed for altering the predetermined quantity of charge in said respective charge storage zone,
applying a pulsed signal to be analyzed to each of said charge storage zones,
altering the quantity of charge in each of a plurality of said charge storage zones as a function of the length of time the potential of said pulsed signal to be analyzed exceeds the respective predetermined threshold potential of each respective charge storage zone so that the quantity of charge stored in a plurality of said charge storage zones is differently altered by said application of said pulsed signal, and
measuring the charge stored in each of said charge storage zones subsequent to application of said signal.

8. A method in accordance with claim 7 wherein from about 10 to about 500 charge storage zones are provided.

9. A integrated circuit device comprising means for receiving a pulse signal to be analyzed, first threshold integrating device means for accumulating charge in a plurality of charge storage zones as respective functions of the length of time said signal exceeds each of a plurality of different threshold potentials, first filter means for dispersively filtering said signal in accordance with a predetermined filter function to provide a signal of altered waveform, and second threshold integrating means for accumulating charge in a plurality of charge storage zones as respective functions of the length of time said altered signal waveform exceeds a plurality of different threshold reference potentials.

10. A transient signal analyser comprising at least two integrated circuit devices as set forth in claim 9, means for shifting the phase of a pulse signal to provide two output signals of differing phase, and means for directing each of said phase altered signals to at least one of said integrated circuit devices.

11. A device in accordance with claim 9 wherein said filter means is a low pass filter.

12. A device in accordance with claim 9 wherein said filter means is a high pass filter.

13. A device in accordance with claim 9 comprising a plurality of additional successive filter means and threshold integration device means.

* * * * *